(12) United States Patent
Yamashita et al.

(10) Patent No.: US 7,078,975 B2
(45) Date of Patent: Jul. 18, 2006

(54) POWER AMPLIFIER MODULE

(75) Inventors: Kiichi Yamashita, Tsukui-gun (JP);
Tomonori Tanoue, Machida (JP);
Shizuo Kondo, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/247,185

(22) Filed: Oct. 12, 2005

(65) Prior Publication Data
US 2006/0028277 A1 Feb. 9, 2006

Related U.S. Application Data

(63) Continuation of application No. 10/878,308, filed on Jun. 29, 2004, now Pat. No. 6,958,656, which is a continuation of application No. 09/692,182, filed on Oct. 20, 2000, now Pat. No. 6,771,128.

(30) Foreign Application Priority Data
Oct. 28, 1999 (JP) ................................ 11-306266

(51) Int. Cl.
*H03G 3/30* (2006.01)
(52) U.S. Cl. ...................... 330/285; 330/133
(58) Field of Classification Search ................ 327/346, 327/350; 330/133, 134, 285, 288, 289, 296
See application file for complete search history.

(56) References Cited

U.S. PATENT DOCUMENTS

| | | | |
|---|---|---|---|
| 5,477,192 A | 12/1995 | Black et al. | 330/288 |
| 5,841,320 A | 11/1998 | Ichihara | 330/133 |
| 5,900,781 A | 5/1999 | Igarashi et al. | 330/254 |
| 5,900,782 A | 5/1999 | Igarashi et al. | 330/254 |
| 6,084,471 A | 7/2000 | Ruth, Jr. et al. | 330/254 |
| 6,121,841 A | 9/2000 | Sakuno | 330/285 |
| 6,759,906 B1 | 7/2004 | Matsunaga et al. | 330/285 |
| 6,771,128 B1 | 8/2004 | Yamashita et al. | 330/285 |
| 6,958,656 B1 * | 10/2005 | Yamashita et al. | 330/285 |

FOREIGN PATENT DOCUMENTS

| | | |
|---|---|---|
| JP | 9-270650 | 10/1997 |
| JP | 9-289424 | 11/1997 |
| JP | 10-28023 | 1/1998 |

* cited by examiner

*Primary Examiner*—Steven J. Mottola
(74) *Attorney, Agent, or Firm*—Miles & Stockbridge P.C.

(57) ABSTRACT

The present invention provides a power amplifier module featuring that: its output power characteristic smoothly changes as the input control voltage changes; and its control sensitivity is stable over a wide dynamic range. By same means, idling current for gain setting is supplied to a single amplifier element or all of multiple stages of amplifier elements of the power amplifier module. By making this idling current behave so as to exponentially change, relative to input control voltage, the invention enables output power control proportional to the input control voltage.

8 Claims, 8 Drawing Sheets

POWER AMPLIFIER MODULE

CROSS-REFERENCE TO RELATED APPLICATION

This application is a continuation of application Ser. No. 10/878,308 filed Jun. 29, 2004 (now U.S. Pat. No. 6,958,656 issued Oct. 25, 2005), which is a continuation of application Ser. No. 09/692,182 filed Oct. 20, 2000 (now U.S. Pat. No. 6,771,128 issued Aug. 3, 2004).

FIELD OF THE INVENTION

The present invention relates to a power amplifier module, particularly to a technology that is effectively applied to a power amplifier module for a cellular phone system with the capability of output power control to be used on portable terminal equipment used in a mobile communication system.

BACKGROUND OF THE INVENTION

Significant growth has lately been found in the market of cellular phone systems, typically, such as a Global System for Mobile Communication (GSM) and a Personal Communication Network (PCN) and this tendency is anticipated to continue in the future. One of the requirements of such systems as GSM and PCN is that the output power of portable terminal equipment can be controlled, dependent on the distance from a base station to the equipment. This can be fulfilled by controlling the gain of the power amplifier module installed on the equipment.

Figure 9:
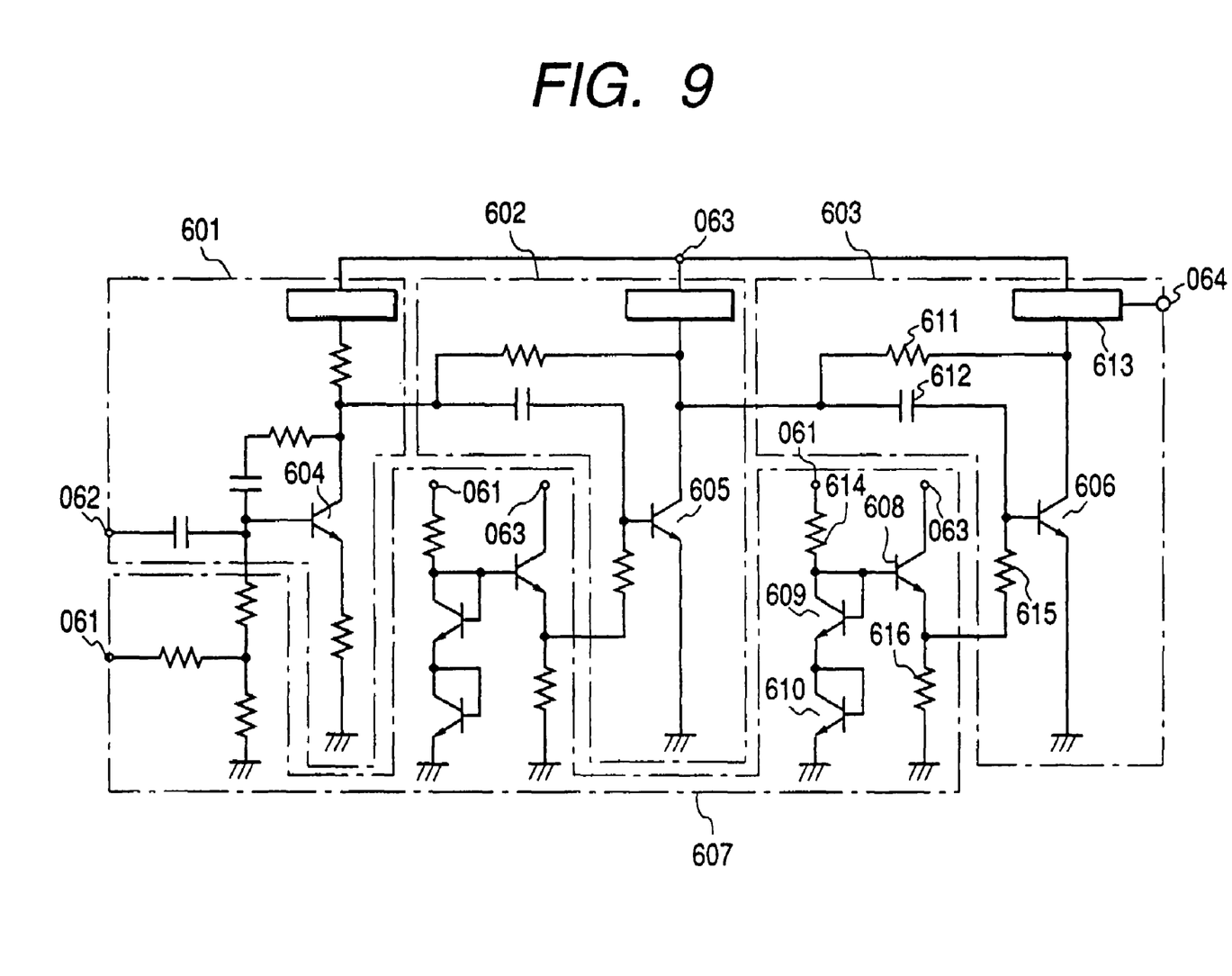
FIG. 9 is a circuit diagram showing an example of prior art.

FIG. 9 shows an example of a typical conventionally used power amplifier module with three stages of output power control. In this power amplifier module, a signal input through a pin 062 is amplified by first-stage, second-stage, third-stage amplifiers 601, 602, 603, and output through a pin 064. Power source voltage is applied to a pin 063. At this time, an output power control circuit 607 controls the gains of the amplifiers 601, 602, and 603 by changing an idling current that determines a DC bias of transistors 604, 605, and 606. Hetero-Bipolar Transistors (GaAsHBTs) are used as the transistors 604, 605, and 606.

Using the above third-stage amplifier 603 and its output power control circuit 607, the output power control function will be explained below. The amplifier 603 comprises a transistor 606, a resistor 611, coupling capacitance 612, and an output adjustment circuit 613. The output power control circuit 607 comprises transistors 608, 609, and 610 and resistors 614, 615, and 616. Here, the diode-connected transistors 609 and 610 and the diode-connected transistors 608 and 606 form a current mirror circuit. Current that is as large as mirror ratio times the current flowing across the transistors 609 and 610 flows through the transistor 606 as the idling current.

The voltage across the transistors 609 and 610 becomes substantially constant when an output power control voltage applied to a pin 061 becomes higher than the boot voltage of these transistors. In the voltage region higher than the boot voltage, the idling current increases or decreases in proportion to the control voltage. Because the gain depends on this idling current, the gain can be made variable by controlling the idling current. In fact, the output power control uses this characteristic. In the conventional module example shown in FIG. 9, the idling current to flow in the first-stage amplifier 601 is generated by applying a voltage produced by dividing the control voltage by resistance to the base of the amplifier. This means taken is different from the means of idling current supply for the second-stage amplifier 602 and the third-stage amplifier 603.

SUMMARY OF THE INVENTION

Output power control characteristic requirements are that output power shall change as a monotone function relative to the control voltage in a wide dynamic range of 70 to 80 dB (the output power typically ranges between −40 and 35 dBm for GSM) and that its change factor, or in other words, control sensitivity shall fall within a predetermined value (which is, typically, 150 dB/V or below). In the conventional module example shown in FIG. 9, however, the idling current changes in proportion to the control voltage.

For the circuit shown in FIG. 9, control sensitivity $\partial P_{21}/\partial Vapc$ becomes greater as the signal level decreases. This is expressed as:

$$P_{21} = \text{a constant} + 20 \log I_d \text{ (dB)}, \quad I_d = (Vapc - 2Vb)/Rapc \quad (1)$$

$$\partial P_{21}/\partial Vapc = 20/(Vapc - 2Vb)(dB/V) \quad (2)$$

where $Vapc > 2Vb$ $$\partial P_{21}/\partial Vapc = 0 \text{ where } Vapc \leq 2Vb \quad (3)$$

The above equations (1) and (2), where $P_{21}$ is gain, $I_d$ is idling current, Vapc is control voltage, Vb is base-emitter voltage of the transistors 609 and 610, and Rapc is the resistance of the resistor 614, indicate the following. When the control voltage exceeds the sum of the boot voltages of the transistors 609 and 610, the idling current starts to flow, resulting in the greatest control sensitivity. The control sensitivity becomes theoretically infinity, but there are many cases where the input signal power level is actually 0 dBm or higher and the DC current generated by a self-bias effect causes the control sensitivity to be around 300 dB/V. For equation (3), idling current $I_d$ is generated if $Vapc \leq 2Vb$, but there is no input of the required control voltage Vapc, causing that a $\partial P_{21}/\partial Vapc = 0$.

Figure 10:
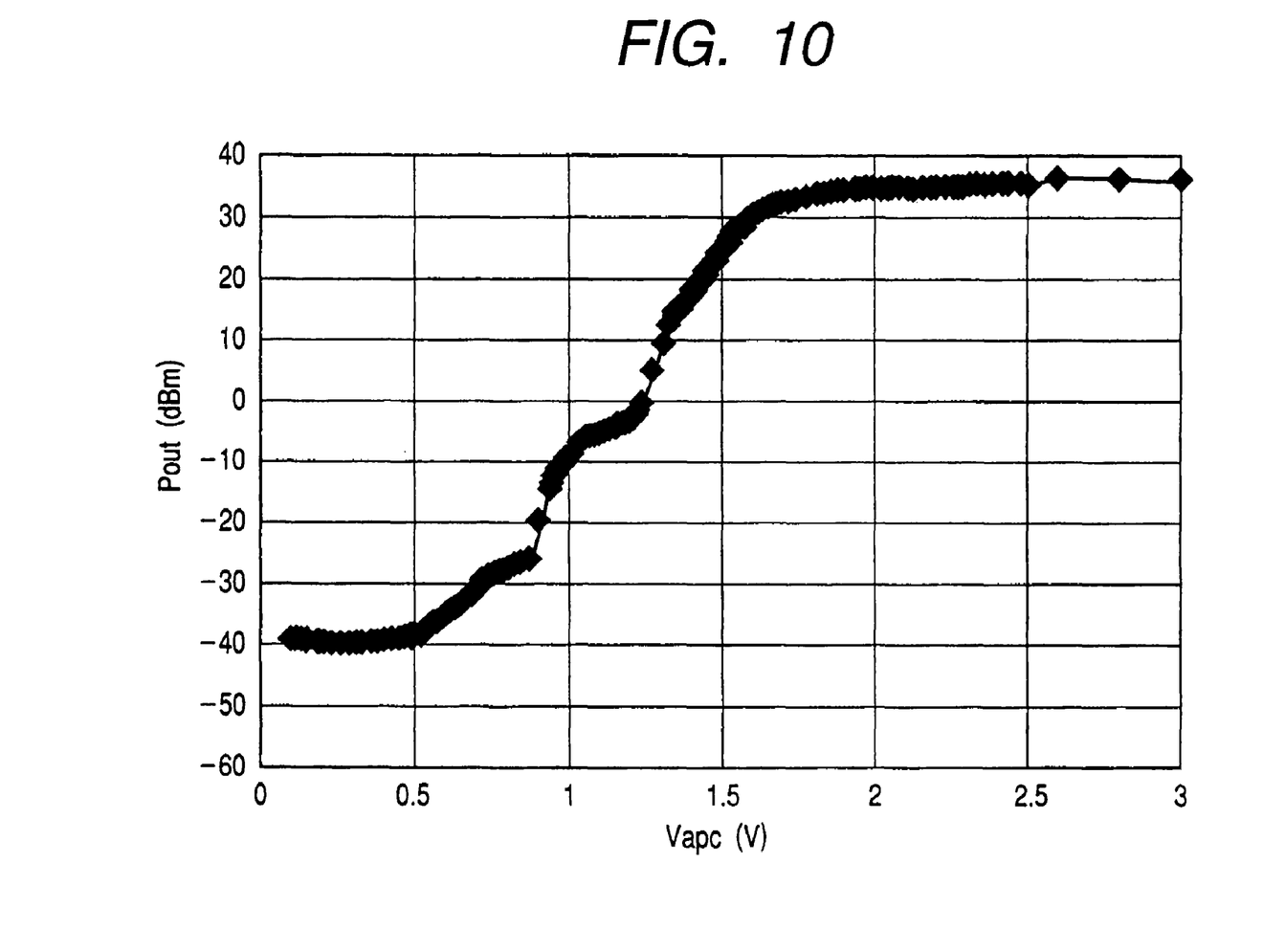
FIG. 10 is a characteristic chart for explaining the operation of the power amplifier module shown in FIG. 9.

For the above conventional module example, the first-stage amplifier 601, the second-stage amplifier 602, and the third-stage amplifier 603 operate in different states. Due to this, a kink is liable to take place in the control characteristic, which made it difficult to satisfy the output power control characteristic requirements of the power amplifier module. As apparent from a characteristic chart shown in FIG. 10, the control characteristic greatly changes, depending on the power at the input signal pin, and a control voltage Vapc level section representing extremely high sensitivity appears. When the sensitivity becomes extremely high as the characteristic chart shows, the output power Pout greatly changes with even small change of the control voltage Vapc. When a feedback to return such excessive change of the output power Pout to normal is applied, the characteristic also responds to the feedback and such a oscillation state appears that the output power Pout cyclically changes for a period corresponding to the feedback loop.

An object of the present invention is to provide a power amplifier module featuring that its output power characteristic smoothly changes as the input control voltage changes and that its control sensitivity is stable over a wide dynamic range. Another object of the present invention is to provide a power amplifier module of convenient service. The above and other objects as well as noticeable features of the present invention would be elucidated from the whole text of the present specification and the related drawings.

A typical power amplifier module embodied by the invention disclosed herein will be summarized below. The power amplifier module accomplishes output power control in such a manner that: upon the reception of control input voltage, idling current is generated and adjusted such that it exponentially changes, relative to the control input voltage and the idling current is supplied to a power amplifier element.

BRIEF DESCRIPTION OF THE DRAWINGS

Other objects and advantages of the invention will become apparent during the following discussion of the accompanying drawings, wherein.

DETAILED DESCRIPTION OF THE PREFERRED EMBODIMENTS

Figure 1:
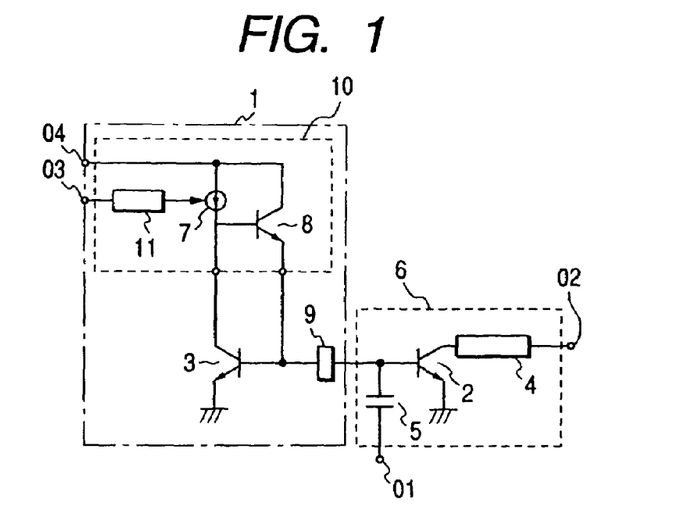
FIG. 1 is a basic circuit diagram showing a power amplifier module as a preferred embodiment of the present invention.

FIG. 1 shows a basic circuit diagram of a power amplifier module as a preferred embodiment of the present invention. Any of the circuit elements in FIG. 1 is a discrete circuit module comprising a single semiconductor integrated circuit or a plurality of semiconductor integrated circuits and an external component connected to it or them. The power amplifier module of first embodiment comprises an amplifier 6 that consists of an output transistor 2, an adjustment circuit 4, and coupling capacitance 5 and an output power control circuit 1 that consists of a V-I logarithmic conversion circuit 11, a constant current source 7, input transistors 3 and 8, and an impedance circuit 9.

The V-I logarithmic conversion circuit 11 executes logarithmic conversion of an input control voltage, that is input through a pin 03, into current. This circuit 11 enables the idling current in the output transistor 2 to exponentially change relative to the input control voltage. The transistor 8 supplies the DC component of a base current that is generated, as an increment by the self-bias effect during the large-signal operation mode, and flows across the output transistor 2.

The impedance circuit 9 is used to prevent the instability of operation due to that a high-frequency signal of the input signals input through the pin 01 flows through the above-mentioned input transistor 3. Reference number 04 is a power source pin. The input transistor 3 forms a current mirror circuit in conjunction with the output transistor 2 and has a current sensing function. Therefore, when a reference current from the constant current source 7 is allowed to flow across the input transistor 3, current that is as large as mirror ratio times the reference current is allowed to flow across the transistor 3 as the idling current.

In the above-mentioned conventional module example shown in FIG. 9, the idling current changes in proportion to the control voltage, whereas, as a feature of the circuitry of this first embodiment, the idling current is adjusted such that it exponentially changes, relative to the input control voltage. The following equations give gain $P_{21}$ and control sensitivity $\partial P_{21}/\partial$ Vapc in small-signal operation mode of first embodiment:

$$P_{21} = a\ \text{constant} + \alpha\ Vapc/Vt \times 20 \log e\ (dB),$$

$$I_d = I_s \exp(\alpha\ Vapc) \quad (4)$$

$$\partial P_{21}/\partial\ Vapc = \alpha/Vt \times 20 \log e = 347\alpha\ (dB/V) \quad (5)$$

where $I_s$ and Vt (up to 25 mV) are physical constants and $\alpha$ is a coefficient. Equation (4) indicates that the gain is proportional to the input control voltage Vapc. From this, as is indicated in equation (5), it is seen that control sensitivity is constant in the present invention and desired control sensitivity can be obtained if coefficient $\alpha$ is set at a suitable value. For example, set coefficient $\alpha$ at 0.5 or less in order to give control sensitivity of 150 dB/V or below. This is attributed to the adjusted behavior of the idling current $I_d$ that exponentially changes, relative to the input control voltage Vapc. Most power amplifier modules used for practical application consist of a plurality of amplifiers. In practical situations, it is advisable to suitably allot the desired control sensitivity required for a power amplifier module among the multiple stages of amplifiers, according to their capabilities.

In the present invention, the relation of exponential function between the current supplied from the constant current source 7 and the input control voltage Vapc holds true. Thus, the idling current $I_d$ exponentially changes, relative to the input control voltage Vapc, as was indicated in equation (4). Here, the value of the idling current $I_d$ is determined from such DC bias of the output transistor 2 as to give desired output power and efficiency. On the other hand, an input signal is input through a pin 01, passes through the coupling capacitance 5, and after being amplified through the output transistor 2 and the adjustment circuit 4, it is output through a pin 02. Because the idling current $I_d$ exponentially changes, relative to the input control voltage Vapc, the gain (dB), or in other words, output power (dBm) increases or decreases in proportion to the input control voltage Vapc.

Figure 7:
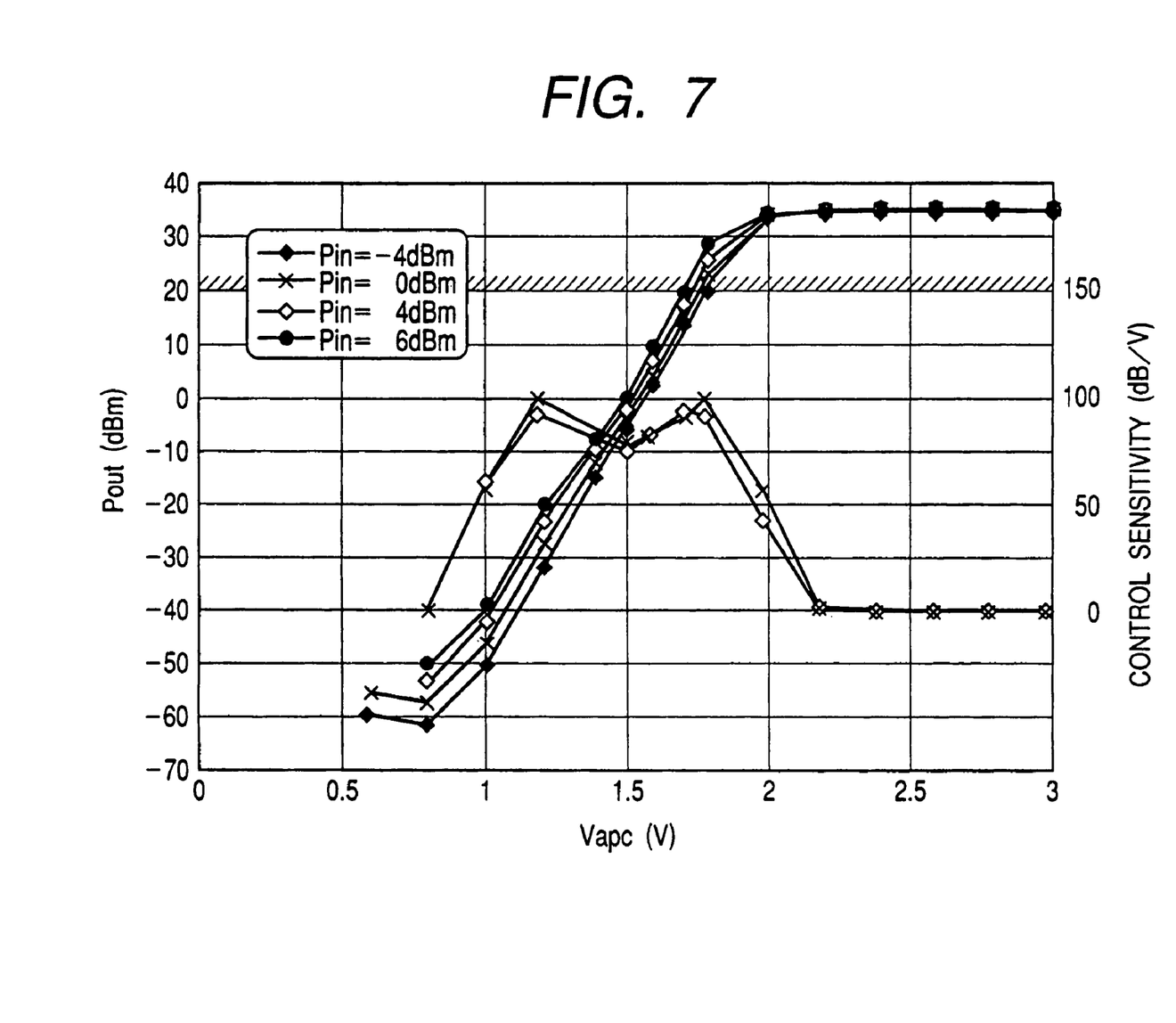
FIG. 7 is a characteristic chart for explaining the operation of power amplifier modules that are embodiments of the present invention.

Therefore, constant control sensitivity such as a value of 347$\alpha$ (dB/V) for an input control voltage Vapc, as was indicated in equation (5), can be obtained. During the operation explained above, a smooth output power control characteristic with little kinks can be measured as apparent from the characteristic chart shown in FIG. 7. Here, even if the power at the input signal pin is variable among decibel values −4 dBm, 0 dBm, 4 dBm, and 6 dBm, stable output power control can be achieved. In this way, the invention can provide a power amplifier module with an exceedingly good control characteristic and of convenient service.

For the transistors 2, 3, and 8, any type of bipolar transistors such as GaAsHBTs, SiGeHBTs, or Si bipolar transistors can be applicable, as will be described later. Because the transistors 2 and 3 form a current mirror circuit, it is desirable that they are same type transistors and integrated on a same chip. For a current supply circuit 10 that supplies current to the transistors 2 and 3, an integrated circuit to which Si bipolar process is applied as well as HBT may be used. The V-I logarithmic conversion circuit 11 and the constant current source 7 may be any circuit type, provided they function, assuring that the reference current flows across the transistor 3, while changing exponentially, relative to the control voltage.

Figure 2:
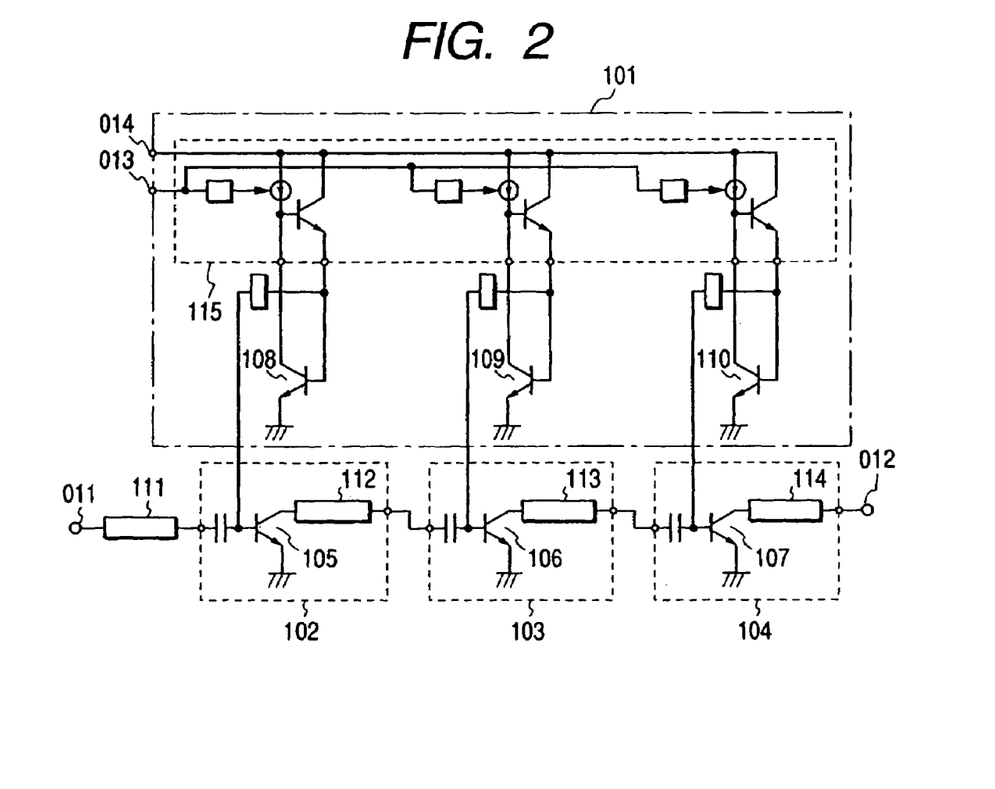
FIG. 2 is a circuit diagram showing a power amplifier module as another preferred embodiment of the present invention.

FIG. 2 shows a circuit diagram of a power amplifier module as another preferred embodiment of the present invention. This second embodiment module comprises three stages of power amplifiers connected in tandem. This configuration of the power amplifier module may comprise two stages for systems of relatively small output power requirement, for example, such as a Code Division Multiple Access (CDMA) system.

Unlike the above-mentioned conventional multi-stage amplifier module shown in FIG. 9, three stages of amplifiers of second embodiment are supplied with the reference current that determines the idling current to flow through the transistors in the stages from an output power control circuit 101 that executes control operation by same means. The idling currents flowing across transistors 105, 106, and 107 for amplification (corresponding to the above-mentioned transistor 2) in amplifiers 102, 103, and 104 are as large as mirror ratio times the currents flowing across current sensing transistors 108, 109, and 110 (corresponding to the above-mentioned input transistor 3), respectively.

Note that different current mirror ratios are set for the amplifiers 102, 103, and 104, according to the difference in the dimensions of the transistors 105 and 108, the transistors 106 and 109, and the transistors 107 and 110. The smallest mirror ratio is set for the first-stage transistor 105 for which the smallest operating power is required. The greatest mirror ratio is set for the last-stage transistor 107 for which the greatest operating power is required. The greater the mirror ratio, the greater the idling current flows through the transistor.

According to the second embodiment, the transistors 105, 106, and 107 carry different idling currents that are determined by different current mirror ratios as described above, and consequently the amplifiers fundamentally operate in the same manner even if input power levels are different. Therefore, the amplifier module can be embodied, exhibiting the smoother output power control characteristic apparent from the characteristic chart shown in FIG. 7, as compared with the conventional module example where the first-stage amplifier and the second-stage and third-stage amplifiers operate in different manners. In fact, the output power characteristic of the combined amplifiers of second embodiment exhibits smooth linear change with little kinks, which is made possible by the present invention.

Then, the circuit operation of second embodiment will be explained below. An input signal is applied to a pin 011 of the power amplifier module. The input signal passes through an adjustment circuit 111 where the signal source impedance is adjusted to an impedance match for input to the transistor 105 and is conveyed to the transistor 105 where its power is amplified. The amplified signal passes through an adjustment circuit 112 where the output impedance of the transistor 105 is adjusted to an impedance match for input to the transistor 106 and is supplied to the base of the transistor 106.

The signal thus conveyed to the transistor 106 is similarly conveyed from the transistor 106 through an adjustment circuit 113 to the transistor 197 and passes through an adjustment circuit 114, during which its power is serially amplified, and eventually it is output through a pin 012. As described above, a constant value of control sensitivity is given for a control voltage. If the amplifiers 102, 103, and 104 respectively have control sensitivity $\partial P_{21}/\partial Vapc$, control sensitivity $\partial P'_{21}/\partial Vapc$, and control sensitivity $\partial P''_{21}/\partial Vapc$, the control sensitivity of the whole power amplifier module $\partial P_{o21}/\partial Vapc$ is given by:

$$\partial P_{o21}/\partial Vapc = \partial P_{21}/\partial Vapc + \partial P'_{21}/\partial Vapc + \partial P''_{21}/\partial Vapc \quad (6)$$

The result is the sum of the values of control sensitivity of all amplifiers stages.

Equation (6) indicates that desired control sensitivity of the module is obtained by assigning required sensitivity components to the stages of amplifiers and the percentages of the components are optional. If desired control sensitivity is, for example, 150 dB/V or below and its even components are assigned to the amplifier stages, assign control sensitivity of 50 dB/V or below to each stage of amplifier so that the intention can be met.

A current supply circuit 115 or the amplifiers and the output power control circuit may be integrated on a single chip by applying Si bipolar transistors and SiGeHBT process. It is desirable to integrate the transistors 105 through 110 on a same chip in order to reduce the size of the power amplifier module as well as provide uniform characteristics.

Figure 3:
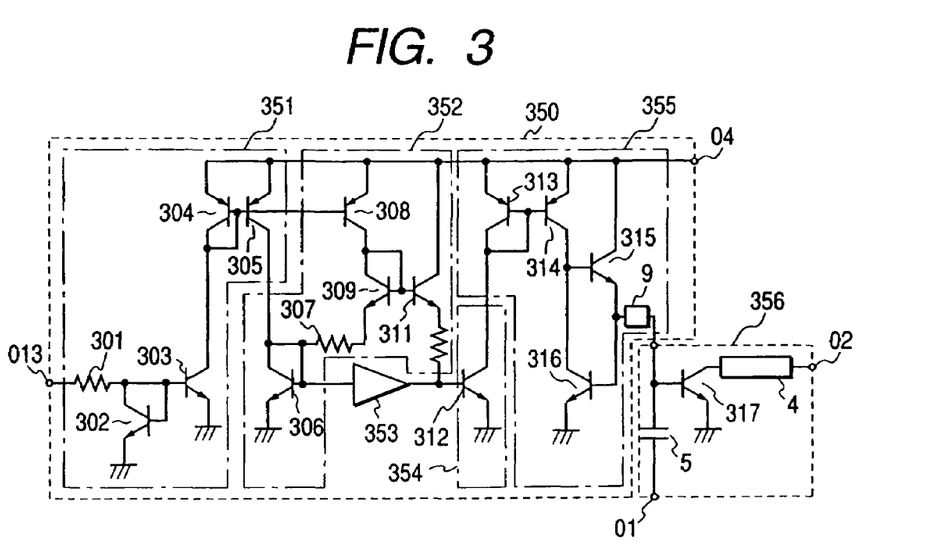
FIG. 3 is a circuit diagram showing a concrete power amplifier module as another preferred embodiment of the present invention.

FIG. 3 shows a circuit diagram of a concrete power amplifier module as another preferred embodiment of the present invention. An output power control circuit 350 is to establish the relation of exponential function between the idling current and the control voltage such that the idling current exponentially changes, relative to the control voltage. For this purpose, it is advisable to make the reference current behave as the exponential function of the control voltage when flowing across an input transistor 316 that forms a current mirror circuit in conjunction with an output transistor 317.

The method and circuit operation for embodying this will be described below. First, a V-I conversion circuit 351 generates current that is proportional to the input control voltage Vapc that is input through a pin 013. When the input control voltage Vapc exceeds the base-emitter voltage of a transistor 302, the current determined by a resistor 301 starts to flow through the transistor 302. Because the transistors 302 and a transistor 303 form a current mirror circuit, current that is as large as mirror ratio times the current flowing through the transistor 302 then starts to flow across the transistor 303.

After a current mirror circuit formed by transistors 304 and 308 reverses the direction of the current, the current is supplied via a transistor 309 to a resistor 307 and converted into voltage again. At this time, a transistor 305 supplies current to a transistor 306, thereby forming a pseudo voltage source. Voltage to be generated in the resistor 307 changes from the origin voltage that is generated by the above pseudo voltage source, that is, the base-emitter voltage of the transistor 306. The above process is carried out as preparation for establishing the relation of exponential function between the reference current to flow across a transistor 316 and the input control voltage Vapc. Meanwhile, because the voltage occurring across the resistor 307 is proportional to the input control voltage Vapc, a value of the α coefficient in the equations (4) and (5) can be determined by using the ratio of the resistance of the resistor 307 to the resistance of the resistor 301, which eventually can determine control sensitivity.

For example, increasing the resistance of the resistor 307 causes control sensitivity to increase because the voltage across the resistor 307 rises; inversely, decreasing the resistance causes control sensitivity to decrease. This means that control sensitivity can be determined by properly selecting a value of the α coefficient. The α coefficient primarily depends on the relative ratio of the resistance of the resistor 307 to the resistance of the resistor 301. Thus, the value of α is substantially constant, regardless of the productive deviation of the resistors. In other words, the control circuit of third embodiment has control sensitivity that is not susceptible to productive deviation, provided its circuit elements are packaged on a single semiconductor integrated circuit.

The voltage occurred across the resistor 307 is conducted via level-shift transistors 309 and 311 to the base of a transistor 312 where it is converted into a collector current of the transistor 312. At this time, because the emitter of the transistor 312 is grounded, the collector current is caused to exponentially change, according to the relation of exponential function between the current and the base voltage, that is, input control voltage Vapc.

After its direction is reversed by a current mirror circuit formed by transistors 313 and 314, that is, a constant current source, this collector current is supplied to the transistor 316 as reference current. A temperature characteristic control circuit 353 performs the task of adjusting the temperature characteristic of the reference current flowing through the transistor 316. Because the base-emitter voltage of the transistor 317 has a negative coefficient of temperature, the collector current continues to increase as temperature rises. The temperature characteristic control circuit 353 sets the temperature characteristic of the reference current to be supplied to the transistor 316 so that the coefficient of temperature of the current at high temperature will be less than the coefficient of temperature of the current at normal temperature. In this way, the circuit 353 functions to suppress the increase of the current due to the rise of the temperature of the transistor 317.

A transistor 315 supplies the DC component increment of the current to flow in the base of the transistor 317 when an amplifier 356 operates in large-signal mode. The output power control circuit 350 can be integrated by the Si process. However, the transistor 316 and the transistor 317 are same devices and should be integrated on a same chip.

Figure 4:
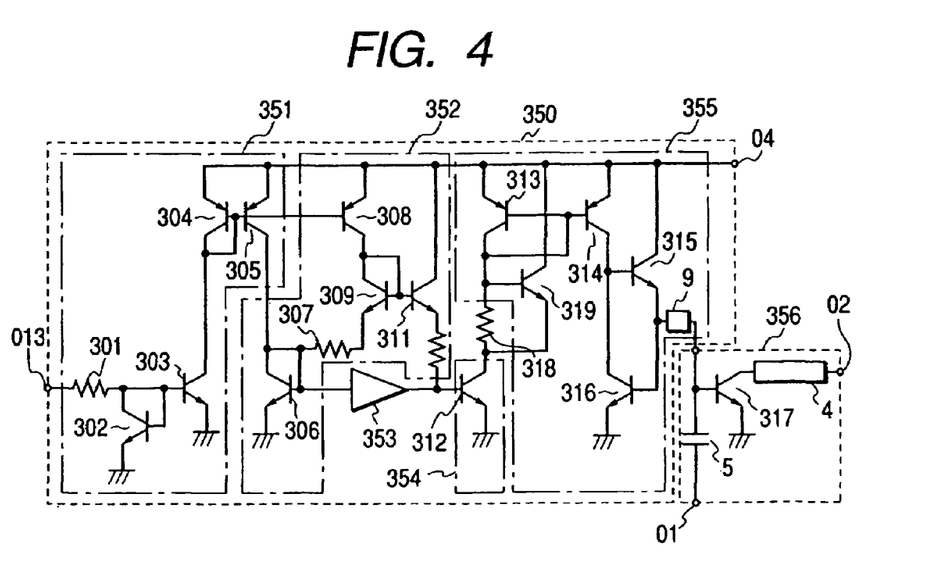
FIG. 4 is a circuit diagram showing another concrete power amplifier module as another preferred embodiment of the present invention.

FIG. 4 shows a circuit diagram of another concrete power amplifier module as another preferred embodiment of the present invention. This circuit of fourth embodiment has an additional output limit function. To the collector of a transistor 312 where the idling current is generated that exponentially changes as described above, a resistor 318 is connected. Voltage occurring across the resistor 318 is applied to the base-emitter of a transistor 319. The transistor 319 performs output limit action by using its base-emitter voltage as a reference voltage for limiting. Specifically, when the voltage drop occurring as the output current from the transistor 312 flows across the above resistor 318 exceeds the base-emitter voltage of the above transistor 319, the transistor 319 is activated and forms a bypass path of the current from a power source pin 04 to the collector of the transistor 312. Consequently, even if the above input control voltage Vapc further increases, which in turn increases the control current generated in the transistor 312, the increment of the current flows through the transistor 319. Therefore, the current to be supplied to the above transistor 313 is constant and the gain of the output transistor 317 is limited.

Figure 5:
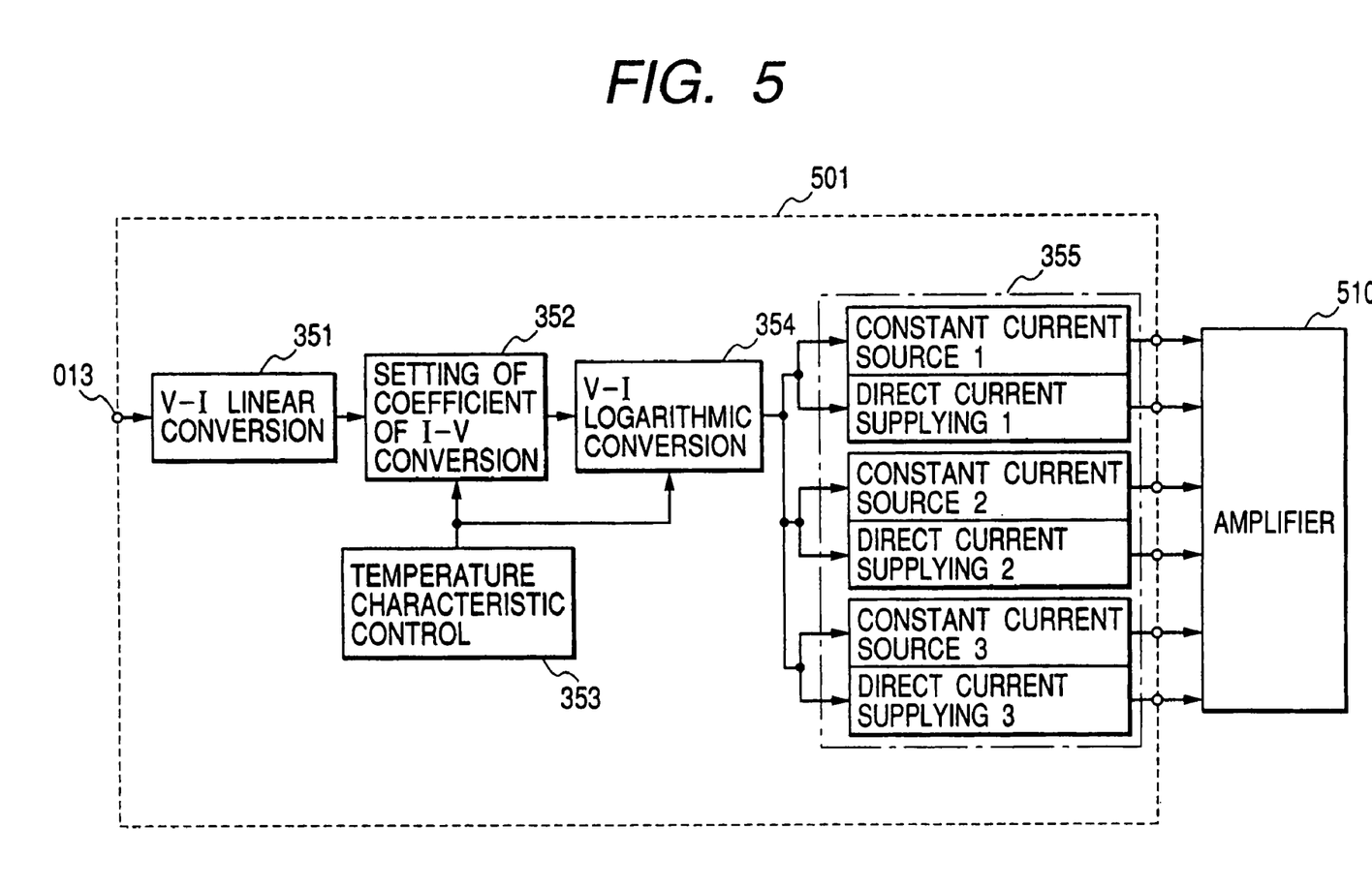
FIG. 5 is a block diagram showing a power amplifier module of three-stage configuration as another preferred embodiment of the present invention.

FIG. 5 shows a block diagram of a power amplifier module of three-stage configuration as another preferred embodiment of the present invention. An output power control circuit 501 that controls the idling current supply to an amplifier 510 may be configured such that the control circuit 350 in FIG. 3 or FIG. 4 and its duplicates, a total of three control circuits are used in tandem as presented in FIG. 2. In this fifth embodiment, however, for circuit simplification purposes, the circuit 501 is configured as follows. A V-I current conversion circuit 351, a circuit for setting of coefficient of I-V conversion 352, a temperature characteristic control circuit 353, and a V-I logarithmic conversion circuit 354 are common ones that are shared with three stages of amplification. Only a current supply circuit 355 is configured to have three stages for three stages of amplification in the amplifier 510, comprising three constant current sources, each of which consists of the transistors 313 and 314 in FIG. 3 or FIG. 4 and three DC supplies, each of which consists of the transistors 315 and 316 that supply DC current and idling current to the transistor 317. The basic operation of the fifth embodiment module is the same as that of the embodiment shown in FIG. 2 and its explanation will not be repeated.

Figure 6:
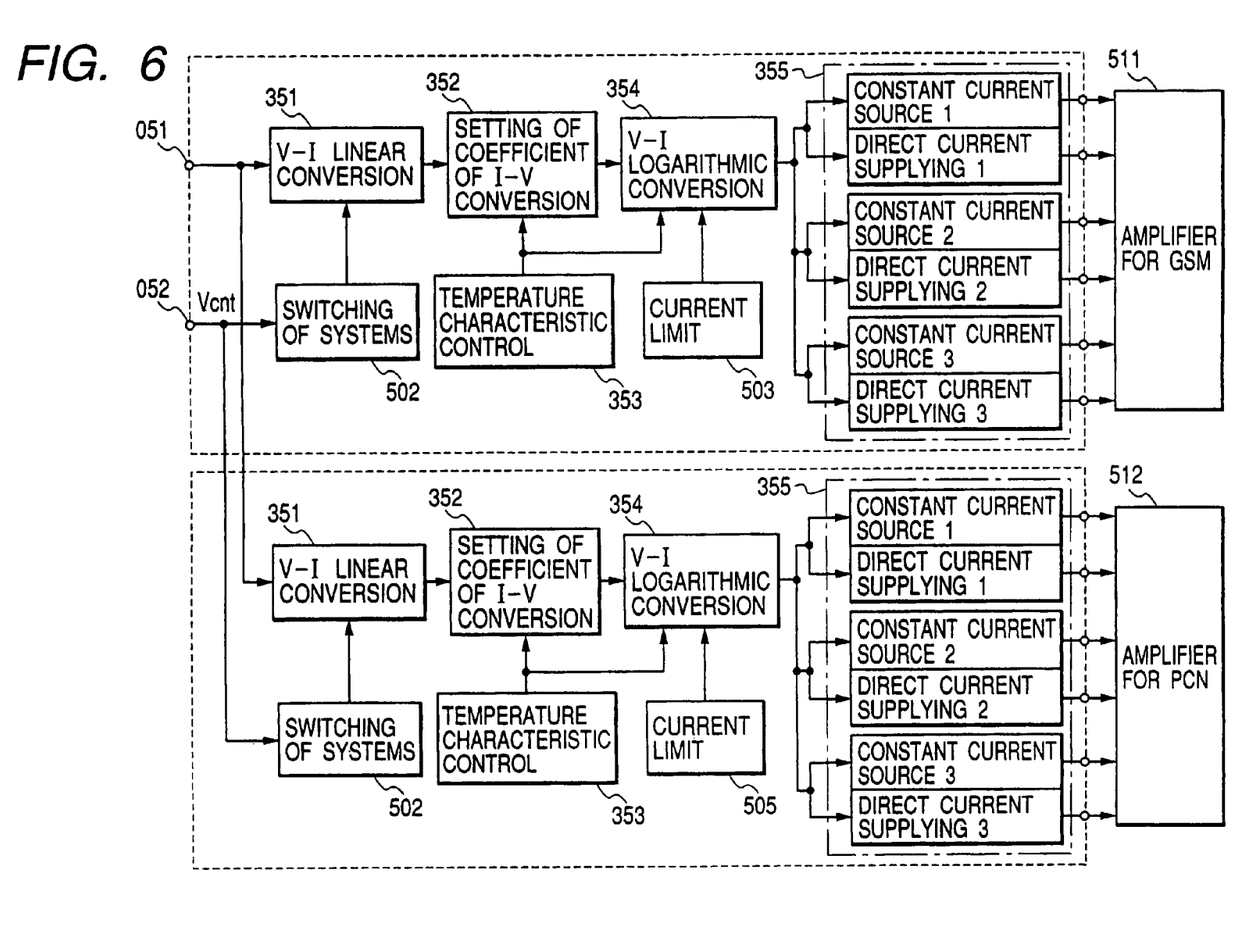
FIG. 6 is a block diagram of a power amplifier module as another preferred embodiment of the present invention.

FIG. 6 shows a block diagram of a power amplifier module as another preferred embodiment of the present invention. In this sixth embodiment module, there are two duplicated systems of the output power control circuits 501 shown in FIG. 5 to operate for two different systems, for example, GSM and PCN systems. These output power control circuits 591 have a function of switching between amplifiers 511 and 512. The module includes circuits 502 and 504 for switching between both amplifiers by a Vcnt control signal that is input through a pin 052 and current limit circuits 503 and 505 for limiting a rapidly increasing reference current due to the rise of control voltage as described above with FIG. 4.

Switching between the amplifiers is performed in accordance with, for example, the following condition setting. When the Vcnt control signal is "High" level (lower than 2 V), the amplifier for GSM system is active and the other amplifier for PCN system is inactive. When the Vcnt control signal is "Low" level, inversely, the amplifier for GSM is inactive and the other amplifier for PCN is active. Alternatively, the above levels of the Vcnt control signal may be upside down.

The current limit circuits 503 and 505 in FIG. 6 can be embodied as follows. As shown in FIG. 4, the resistor 318 for current sensing is connected to the collector end of the transistor 312 and both ends of the resistor 318 are connected to the base-and-emitter-coupled transistor 319 for current bypassing. Because the voltage across the resistor 318 becomes substantially constant when it exceeds the base-emitter voltage of the bypassing transistor 319, further extra current is bypassed via the transistor 319. In this way, the above-mentioned current limit function can be implemented. The current limit level is determined by the resistor 318.

Figure 8:
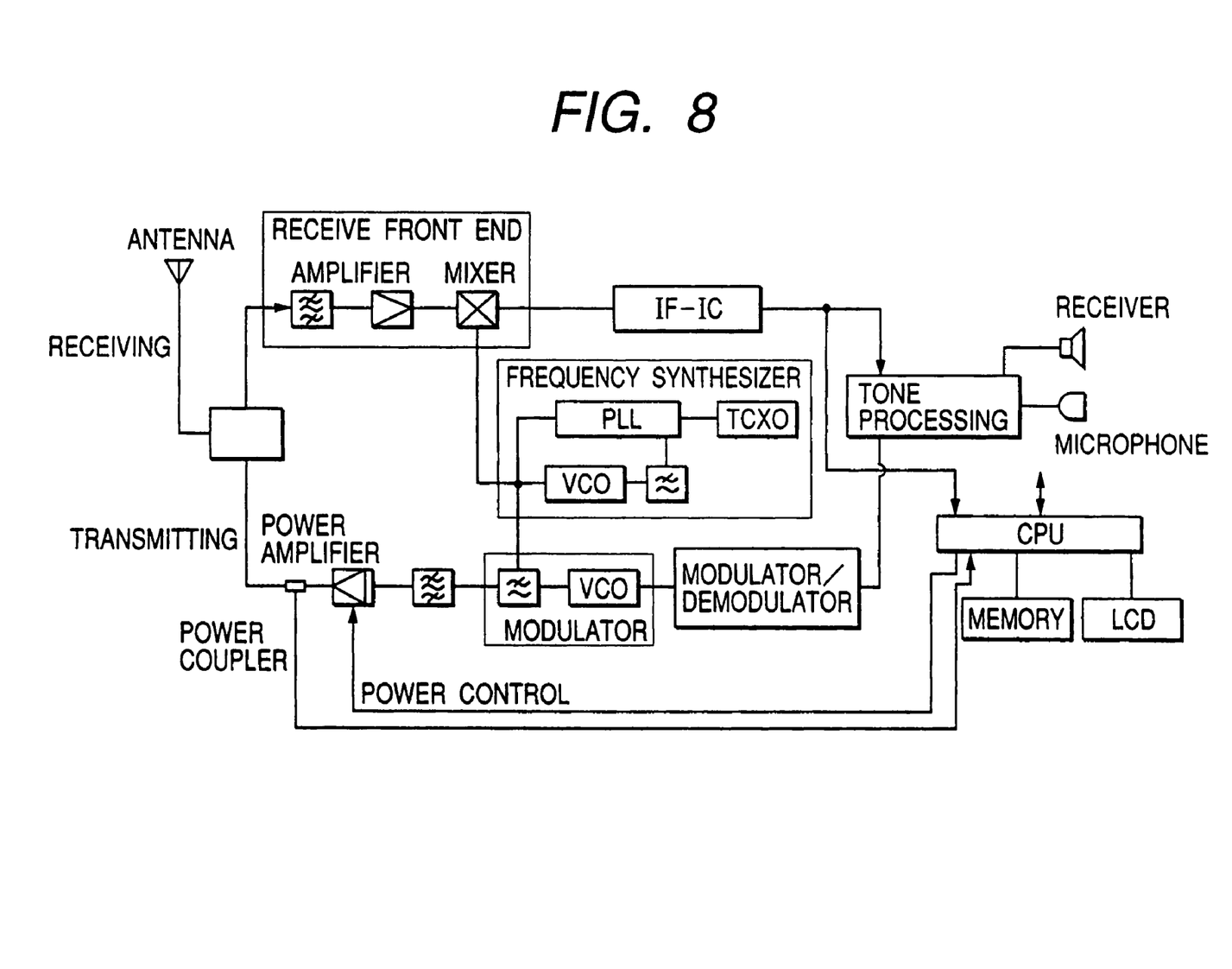
FIG. 8 is an overall block diagram of mobile communication equipment as a preferred embodiment on which a power amplifier module offered by the present invention is used.

FIG. 8 shows an overall block diagram of mobile communication equipment as a preferred embodiment on which a power amplifier module offered by the present invention is used. A typical example of this mobile communication equipment is a portable mobile phone as mentioned above.

Signals received by an antenna are amplified in a receive front-end, converted into an intermediate frequency by a mixer, and conveyed through an intermediate signal processing circuit IF-IC to a tone processing circuit. A gain control signal periodically included among the above received signals is decoded in a microprocessor CPU, which is not limited to a specific one, where an input control voltage to be supplied to a power amplifier (power amplifier module) is generated.

The power amplifier executes gain control in accordance with the above input control voltage and generates a send output signal. Part of the power loss is fed back to the above microprocessor CPU via a power coupler so that power control within a given range is performed as explained above. A frequency synthesizer generates an oscillating signal corresponding to the received signal frequency by using a reference oscillator TCXO, a voltage control oscillator VCO, and a PLL loop. This oscillating signal is conveyed to the mixer in the receive front end and supplied to a modulator as well. In the above tone processing circuit, the received signal drives a receiver from which a tone signal is output. Voice to send is converted into electric signals in a microphone and the signals are conveyed through the tone processing circuit and a modulator/demodulator to the modulator.

In such mobile communication equipment, the above power coupler is used or the power source current flowing in the power amplifier circuit is sensed to determine whether power output operation is performed within a given range as specified for send operation and a feedback signal is generated. By means of such feedback loop, the power amplifier executes gain control operation and this may cause oscillation. This oscillation mechanism is as follows. If a partial range of control sensitivity to input control voltage is extremely high, the output power excessively changes when the corresponding input control voltage is supplied. Feedback action to return the excessive change to normal recurs at delay timing during a feedback loop and this causes the output power to fluctuate largely.

Because a maximum distance between base stations is 10 miles (about 16 km), permitted for the above-mentioned GSM system, the output of a portable mobile phone must be controlled on a level ranging between 13 dBm and 43 dBm in 2-dB steps. This output control always controls the send power output of the portable mobile phone. In fact, the output control operation must be performed in accordance with control signals periodically transmitted from a base station. The power amplifier module provided by the present invention has substantially constant control sensitivity for all the region of input control voltages. Its stable control sensitivity over a wide dynamic range enables mobile communication equipment such as the above portable mobile phone to execute high-quality signal transmission.

According to the present invention, as explained above, the idling current to flow the power amplifier module exponentially changes, relative to output power control signals. Thus, the invention enables proportional or linear gain (dB) control in accordance with the input control voltage, providing required stable control sensitivity. As concerns a power amplifier module of multistage configuration, for example, two stages or three stages, because idling current supply to each amplifier stage for power control is performed by same means, the module can be designed to exhibit a good control characteristic with little kinks. Furthermore, the invention is beneficial for cost reduction because the output power control circuit can be fabricated with Si bipolar transistors and the power amplification stages may be fabricated with GaAsHBT, SiGeHBT, and Si bipolar transistors in combination.

The forgoing embodiments produce the following effects:

(1) A power amplifier module accomplishes output power control in the following way: upon the reception of control input voltage, idling current is generated and adjusted such that it exponentially changes, relative to the control input voltage and the idling current is supplied to a power amplifier element. As the input control voltage changes, the output power characteristic smoothly changes. The power amplifier module features stable control sensitivity over a wide dynamic range.

(2) In addition, a control circuit for implementing the above control is configured with a circuit for converting the input control voltage into current, a circuit for generating a reference voltage from the current into which the input control voltage has been converted and setting a gradient of voltage that changes in proportion to the input control voltage, and a circuit for converting the voltage into the idling current that exponentially changes. Thereby, required stable control sensitivity can be set.

(3) In addition, the power amplifier module is configured with a plurality of stages of amplifiers connected in tandem and a plurality of control circuits that receive the control input voltage in common and separately supply the idling current to one of the stages of amplifiers. Because the amplifier stages operate-in the same way, the power amplifier module can be designed to exhibit a good control characteristic with little kinks.

(4) In addition, the power amplifier module uses a common control circuit comprising the circuit for converting the input control voltage into current, the circuit for generating a reference voltage from the current into which the input control voltage has been converted and setting a gradient of voltage that changes in proportion to the input control voltage, and the circuit for converting the voltage into the idling current that exponentially changes. This eliminates the possibility of supply of varying idling currents which otherwise might occur among a plurality of idling current generators. The power amplifier module further includes a plurality of circuits for supplying the idling current to the multiple stages of amplifiers such that each circuit serves each amplifier with the idling current. In this way, the entire module circuit can be designed to be simple.

(5) In addition, the amplifier is fabricated with GaAsHBTs packaged on a semiconductor integrated circuit including a pair of an input transistor and an output transistor; the input transistor carries the above idling current and forms a current mirror circuit in conjunction with the output transistor. The control circuit is fabricated with Si transistors or GaAsHBTs packaged on a semiconductor integrated circuit. Thereby, high-frequency power output operation required for portable mobile phones can be implemented.

(6) In addition, the amplifier is fabricated with SiGeHBTs or Si bipolar transistors packaged on a semiconductor integrated circuit including a pair of an input transistor and an output transistor; the input transistor carries the idling current and forms a current mirror circuit in conjunction with the output transistor. The control circuit is fabricated with SiGeHBTs or Si bipolar transistors. Thereby, high-frequency power output operation required for portable mobile phones can be implemented.

(7) In addition, the power amplifier module further includes a circuit for limiting the idling current when the input control voltage has reached a certain level. Thereby, the module can be designed to perform stable operation with low power consumption.

(8) In addition, the power amplifier further includes a circuit by which the temperature characteristic of the idling current can be set optionally. Thereby, stable power output operation not susceptible to ambient temperature can be achieved.

The present embodiments explained above are to be considered illustrative and the present invention is not limited to the foregoing embodiments. Of course, the invention maybe be embodied in other modification forms within a-scope not departing from the spirit or essence thereof. For example, for the first embodiment shown in FIG. 1, the input transistor 3 that is used as a reference current sensing device is not limited to some transistor type. Instead, a diode or diode-connected transistors of the same material as the transistor 2 for amplification may be used. This substitution does not alter the relation of exponential function between the input control voltage and the idling current.

Mobile communication equipment to which the present invention is applied includes, in addition to those such as mobile phones that perform tone or voice signal transmission/reception, those that perform digital signal transmission/reception to/from a personal computer or other similar mobile communication equipment via a digital telephone switch network by converting digital signals into signals in a tone signal frequency band. For such digital signal transmission/reception, the present invention makes the transmission signal level stable, which can achieve data communications at a higher rate. The present invention can be widely used for power amplifier modules used on such mobile communication equipment.

A typical implementation of the invention disclosed herein produces effects that will be summarized below. According to the present invention, idling current to flow a power amplifier exponentially changes, relative to output power control signals, so that gain can be controlled in proportion to the control voltage and required control sensitivity can be obtained. For a power amplifier module of two-stage or three-stage configuration, because idling current supply to each amplifier stage for power control can be performed by same means, the module can be designed to exhibit a good control characteristic with little kinks.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A power amplifier module comprising:
an amplifier including an output transistor; and
a control circuit for supplying the amplifier with an idling current that controls the output power of the amplifier,
wherein the control circuit includes:
an input transistor carrying the idling current and forming a current mirror circuit in conjunction with the output transistor, and
an impedance circuit coupling a base of the input transistor with a base of the output transistor, and
wherein the control circuit receives input control voltage and makes the idling current behave so as to exponentially change relative to the input control voltage.

2. The power amplifier module according to claim 1, wherein the control circuit includes:
a circuit that converts the input control voltage into current;
a circuit that generates a reference voltage from the current into which the input control voltage has been converted and setting a gradient of voltage that changes in proportion to the input control voltage; and
a circuit that converts the voltage into the idling current that changes exponentially relative to the input control voltage.

3. The power amplifier module according to claim 1, wherein the amplifier is a complex comprising a plurality of stages of amplifiers connected in tandem, and
wherein the control circuit is a complex comprising a plurality of circuits that receive the control input voltage in common and separately supply respective idling currents behaving as aforesaid to the plurality of stages of amplifiers.

4. The power amplifier module according to claim 3, wherein a common circuit is formed, comprising the circuit that converts the input control voltage into current, the circuit that generates a reference voltage from the current into which the input control voltage has been converted and setting a gradient of voltage that changes in proportion to the input control voltage, and the circuit that converts the voltage into the idling current that changes exponentially, and
wherein a plurality of circuits connected to said common circuit supply the respective idling currents to the plurality of stages of amplifiers.

5. The power amplifier module according to claim 1, wherein the power amplifier module further includes a circuit that limits the idling current once the input control voltage has reached a predetermined level.

6. The power amplifier module according to claim 1, wherein the power amplifier module further includes a circuit by which a temperature characteristic of the idling current can be set optionally.

7. The power amplifier module according to claim 2, wherein the amplifier is a complex comprising a plurality of stages of amplifiers connected in tandem, and
wherein the control circuit is a complex comprising a plurality of circuits that receive the control input voltage in common and supply respective idling currents behaving as aforesaid to the plurality of stages of amplifiers.

8. The power amplifier module according to claim 7, wherein a common circuit is formed, comprising the circuit that converts the input control voltage into current, the circuit that generates a reference voltage from the current into which the input control voltage has been converted and setting a gradient of voltage that changes in proportion to the input control voltage, and the circuit that converts the voltage into the idling current that changes exponentially relative to the input control voltage,
wherein a plurality of circuits connected to said common circuit supply the idling currents to the plurality of stages of amplifiers.

* * * * *